(12) United States Patent
Osako

(10) Patent No.: US 7,233,181 B2
(45) Date of Patent: Jun. 19, 2007

(54) PRESCALER CIRCUIT

(75) Inventor: Shinichi Osako, Takatsuki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 162 days.

(21) Appl. No.: 11/202,132

(22) Filed: Aug. 11, 2005

(65) Prior Publication Data

US 2006/0033538 A1 Feb. 16, 2006

(30) Foreign Application Priority Data

Aug. 16, 2004 (JP) ............................. 2004-236654

(51) Int. Cl.
*H03K 21/00* (2006.01)

(52) U.S. Cl. ...................................... 327/115; 327/117

(58) Field of Classification Search ................ 327/115, 327/117; 377/47, 48
See application file for complete search history.

(56) References Cited

U.S. PATENT DOCUMENTS

| 5,948,046 A | * | 9/1999 | Hagberg | ...................... 708/103 |
| 6,157,693 A | * | 12/2000 | Jayaraman | ................... 377/47 |
| 6,163,181 A | * | 12/2000 | Nishiyama | ................... 327/115 |
| 6,834,094 B1 | * | 12/2004 | Liu et al. | ....................... 377/47 |
| 6,882,190 B2 | * | 4/2005 | Choi et al. | ................... 327/115 |

FOREIGN PATENT DOCUMENTS

JP 62-122323 6/1987

* cited by examiner

*Primary Examiner*—Timothy P. Callahan
*Assistant Examiner*—Hai L. Nguyen
(74) *Attorney, Agent, or Firm*—Hamre, Schumann, Mueller & Larson, P.C.

(57) ABSTRACT

A prescaler circuit includes: a frequency number switching part including first to sixth D-type flip-flop circuits, first and second AND circuits and first and second OR circuits; and a frequency division switching control part including a third AND circuit, a third OR circuit and first and second NOR circuits. The frequency number switching part has a function of controlling the frequency division among frequency division numbers of 1/N, 1/(N+1) and 1/(N+2) via the first and the second AND circuits by controlling modulus signals input to the first and the second NOR circuits. The frequency division switching control part has a function of controlling the frequency division between ⅛-frequency-division and 1/16-frequency-division by controlling a modulus signal input to the third AND circuit. A margin for a delay time that causes misoperation at the time of the switching of frequency division numbers can be increased.

11 Claims, 8 Drawing Sheets

PRESCALER CIRCUIT

FIELD OF THE INVENTION

The present invention relates to a prescaler circuit with an increased margin for a delay time that causes misoperation during the switching of frequency division numbers without varying a modulus signal for controlling the frequency division numbers.

BACKGROUND OF THE INVENTION

In recent years, the operation frequency band for mobile communication such as for mobile phones has been made higher, so that a PLL circuit operable at a high-frequency band is required as well, which includes a prescaler that is used for such mobile communication. Then, a method for avoiding misoperation due to a delay time has been proposed. Referring now to FIG. 1, the configuration of a dual-modulus prescaler for avoiding a delay time shown in JP S62(1987)-122323 A (page 2, FIG. 1) will be described below. In addition, the configuration of another conventional dual-modulus prescaler operating in a similar manner but having a configuration different from FIG. 1 will be described, with reference to FIG. 2 and a configuration of a conventional triple-modulus prescaler also will be described.

The conventional dual-modulus prescaler described in JP S62(1987)-122323 A, as shown in FIG. 1, is composed of D-type flip-flop (hereinafter abbreviated as DFF) circuits and logic circuits (NAND circuits). A clock signal that is input from a clock input terminal 11 is input through clock inputs of three DFF circuits 14a, 14b and 14c. A data input of the first DFF circuit 14a is connected to a Q output of the third DFF circuit 14c via a first input of a first NAND circuit 15a. A data input of the second DFF circuit 14b is connected to a NQ output of the third DFF circuit 14c via a first input of a second NAND circuit 15b. A second input of the second NAND circuit 15b is connected to a Q output of the first DFF circuit 14a. A data input of the third DFF circuit 14c is connected to a NQ output of the second DFF circuit 14b. Thus, one feedback loop is configured. By using a second input of the first NAND circuit 15a as a mode switching terminal 13, a control signal from the mode switching terminal 13 allows an output signal in two modes to be output from an output terminal 12, which is an output from the NQ output of the second DFF circuit 14b. ¼-frequency-division can be obtained by the mode switching terminal 13 at a low level, whereas ⅕-frequency-division can be obtained by the mode switching terminal 13 at a high level.

FIG. 2 shows a dual-modulus prescaler operating in the same manner as in FIG. 1, in which similarly to the prescaler of FIG. 1 three DFF circuits are provided. Instead of the two NAND circuits, one AND circuit and one OR circuit are used. A clock signal that is input from a clock input terminal 21 is input through clock inputs of the three DFF circuits 24a, 24b and 24c. A data input of the first DFF circuit 24a is connected to a Q output of the third DFF circuit 24c via a first input of a first AND circuit 25. A data input of the second DFF circuit 24b is connected to the Q output of the third DFF circuit 24c via a first input of a first OR circuit 26. A second input of the first OR circuit 26 is connected to a Q output of the first DFF circuit 24a. A data input of the third DFF circuit 24c is connected to a NQ output of the second DFF circuit 24b. Thus, one feedback loop is configured. By using a second input of the first AND circuit 25 as a mode switching terminal 23, a control signal from the mode switching terminal 23 allows an output signal in two modes to be output from an output terminal 22, which is an output from the NQ output of the second DFF circuit 24b. ¼-frequency-division can be obtained by the mode switching terminal 23 at a low level, whereas ⅕-frequency-division can be obtained by the mode switching terminal 23 at a high level.

The triple-modulus prescaler is, as shown in FIG. 3, configured with two DFF circuits, two AND circuits, one OR circuit and one NOR circuit added to the dual-modulus prescaler shown in FIG. 2. A clock signal that is input from a clock input terminal 31 is input through clock inputs of three DFF circuits 34a, 34b and 34c. A data input of the first DFF circuit 34a is connected to a Q output of the third DFF circuit 34c via a first input of a first AND circuit 35a. A data input of the second DFF circuit 34b is connected to the Q output of the third DFF circuit 34c via a first input of a first OR circuit 36a. A second input of the first OR circuit 36a is connected to a Q output of the first DFF circuit 34a. A data input of the third DFF circuit 34c is connected to a NQ output of the second DFF circuit 34b. Thus, a feedback loop is configured.

A clock input of a fourth DFF circuit 34d is connected to the NQ output of the second DFF circuit 34b. A data input of the fourth DFF circuit 34d is connected to a NQ output of the fourth DFF circuit 34d, whereby a feedback loop is configured with the fourth DFF circuit 34d. A clock input of a fifth DFF circuit 34e is connected to a Q output of the fourth DFF circuit 34d. A data input of the fifth DFF circuit 34e is connected to a NQ output of the fifth DFF circuit 34e, whereby a feedback loop is configured with the fifth DFF circuit 34e. A first input of a second AND circuit 35b is connected to the Q output of the fourth DFF circuit 34d. A first input of a third AND circuit 35c is connected to a Q output of the fifth DFF circuit 34e. A first input of a second OR circuit 36b is connected to an output of the second AND circuit 35b, and a second input thereof is connected to an output of the third AND circuit 35c. A first input of a first NOR circuit 37 is connected to an output of the second OR circuit 36b. A second input of the first AND circuit 35a is connected to an output of the first NOR circuit 37. Thus, one feedback loop is configured.

By using a second input of the first NOR circuit 37 as a first mode switching terminal 33a, a second input of the second AND circuit 35b as a second mode switching terminal 33b and a second input of the third AND circuit 35c as a third mode switching terminal 33c, output signals in three modes can be obtained from the Q outputs of the fourth and the fifth DFF circuits 34d and 34e as first and second outputs 32a and 32d, in accordance with control signals from the first, the second and the third mode switching terminals 33a, 33b and 33c. ⅛-, ⅑- and ⅒-frequency-division can be obtained from the output terminal 32a and ¹⁄₁₆-, ¹⁄₁₇- and ¹⁄₁₈-frequency-division can be obtained from the output terminal 32b. The frequency division numbers of the output signals corresponding to the control signals M1, M2 and M3 from the first, the second and the third mode switching terminals 33a, 33b and 33c are shown in Table 1.

TABLE 1

| Frequency division numbers | M1 | M2 | M3 |
|---|---|---|---|
| 1/8 | H | H | L |
| 1/9 | L | H | L |
| 1/10 | L | L | L |

TABLE 1-continued

| Frequency division numbers | M1 | M2 | M3 |
|---|---|---|---|
| 1/16 | H | H | H |
| 1/17 | L | H | H |
| 1/18 | L | L | H |

The dual-modulus and triple-modulus prescalers can be configured as stated above.

FIG. 4 and FIG. 5 are timing diagrams of the prescaler circuit shown in FIG. 3, where FIG. 4 shows the case of the frequency division numbers of ⅛, ⅑ and 1/10 and FIG. 5 shows the case of the frequency division numbers of 1/16, 1/17 and 1/18. In the prescaler circuit shown in FIG. 3, output signals from the output terminals 32a and 32b of the prescaler circuit are input to a logic part, and modulus signals thereof are input to modulus signal input terminals 33a, 33b and 33c of the prescaler circuit. As shown in FIG. 4, a margin for misoperation when these signals are input to the second input of the first AND circuit 35a is within 7 clock signals at the time of switching from ⅛-frequency-division to ⅑-frequency-division, is within 3 clock signals at the time of switching from ⅑-frequency-division to 1/10-frequency-division and is within 3 clock signals at the time of switching from 1/10-frequency-division to ⅛-frequency-division. Further, as shown in FIG. 5, the margin is within 15 clock signals at the time of switching from 1/16-frequency-division to 1/17-frequency-division, is within 7 clock signals at the time of switching from 1/17-frequency-division to 1/18-frequency-division and is within 7 clock signals at the time of switching from 1/18-frequency-division to 1/16-frequency-division (outside the drawing).

In the prescaler circuit shown in FIG. 3, the smallest margin for misoperation is within 2 clocks. In the case of a clock frequency at 100 MHz, this corresponds to a margin for misoperation of 40 nsec, but in the case of a clock frequency at 2 GHz, the margin for misoperation becomes smaller up to 1 nsec. If a trend toward a higher frequency still continues in the future, the margin for misoperation further will be reduced. As currently possible countermeasures for this, a current in a circuit such as a DFF circuit is increased so as to shorten the total delay time to be kept within the margin for misoperation, or a DFF circuit is provided upstream of the modulus signal input terminal so as to enable the synchronization with the signal prior to the outputting from the prescaler circuit shown in FIG. 3, thus removing a delay time occurring in the logic. These circuit configurations enable the shortening of a delay time, but have the problem of an increase in current.

SUMMARY OF THE INVENTION

Therefore, with the foregoing in mind, it is an object of the present invention to provide a prescaler circuit that does not shorten a total delay time by increasing a current but enlarges a margin of a delay time that causes misoperation while keeping the total delay time as it is, so as to ensure a sufficient margin for misoperation.

In order to cope with the above-stated problems, a prescaler circuit of the present invention includes: first to fourth D-type flip-flop (DFF) circuits; first and second AND circuits; and first and second OR circuits. In this prescaler circuit, an output of the first AND circuit is connected to a data input of the first DFF circuit, a positive output of the first DFF circuit is connected to one input of the second AND circuit, an output of the second AND circuit is connected to a data input of the second DFF circuit, a positive output of the fourth DFF circuit and the positive output of the first DFF circuit are connected to inputs of the first OR circuit, an output of the first OR circuit is connected to one input of the second OR circuit, a positive output of the second DFF circuit is connected to the other input of the second OR circuit, an output of the second OR circuit is connected to a data input of the third DFF circuit, a negative output of the third DFF circuit is connected to a data input of the fourth DFF circuit, and the positive output of the fourth DFF circuit is connected to one input of the first AND circuit. A modulus signal is input to the other input of the first AND circuit, another modulus signal different from the modulus signal input to the first AND circuit is input to the other input of the second AND circuit, and a frequency division number of the prescaler circuit is made variable by controlling the modulus signals input to the first AND circuit and the second AND circuit.

According to the thus configured prescaler circuit, a margin for a delay time that causes misoperation can be increased.

DETAILED DESCRIPTION OF THE INVENTION

Figure 1:
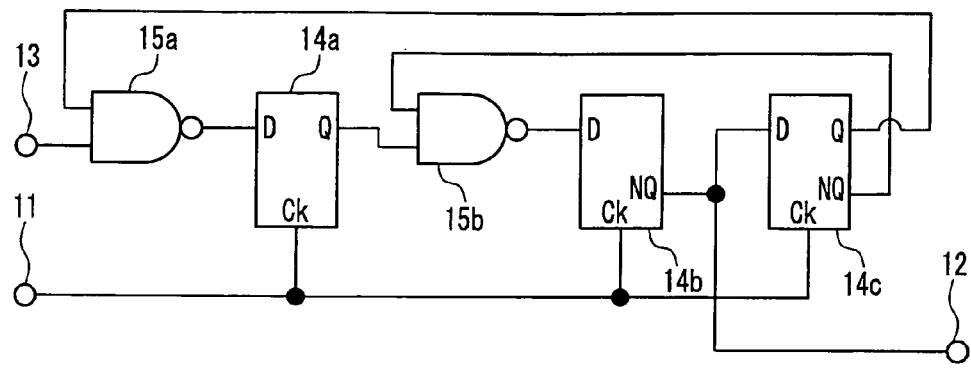
FIG. 1 is a circuit diagram showing a conventional prescaler.

In the configuration of the prescaler circuit of the present invention, preferably, a common clock signal is input to clock inputs of the first to the fourth DFF circuits, so as to enable synchronization among the first to the fourth DFF circuits.

The prescaler circuit further may include a fifth DFF circuit, in which the negative output of the third DFF circuit is connected to a clock input of the fifth DFF circuit, a negative output of the fifth DFF circuit is connected to a data input of the fifth DFF circuit. Output with a frequency division number of ½ is enabled from a positive output of the fifth DFF circuit by controlling an input signal to modulus inputs of the first and the second AND circuits.

The prescaler circuit further may include a sixth DFF circuit, in which the positive output of the fifth DFF circuit is connected to a clock input of the sixth DFF circuit, and a negative output of the sixth DFF circuit is connected to a data input of the sixth DFF circuit. Output with a frequency division number of 1/16 is enabled from a positive output of the sixth DFF circuit by controlling an input signal to modulus inputs of the first and the second AND circuits.

The prescaler circuit further may include a frequency division switching control part including: a third AND circuit; a third OR circuit; a first NOR circuit; and a second NOR circuit. In this prescaler circuit, the positive output of the sixth DFF circuit is connected to one input of the third AND circuit, a modulus signal is input to the other input of the third AND circuit, an output of the third AND circuit is connected to one input of the third OR circuit, the positive output of the fifth DFF circuit is connected to the other input of the third OR circuit, an output of the third OR circuit is connected to one input of the first NOR circuit, another modulus signal different from the modulus signal input to the third AND circuit is input to the other input of the first NOR circuit, an output of the first NOR circuit is connected to a frequency-division number variable input of the first AND circuit, the positive output of the fifth DFF circuit is connected to one input of the second NOR circuit, still another modulus signal different from the modulus signals input to the third AND circuit and the first NOR circuit is input to the other input of the second NOR circuit, and an output of the second NOR circuit is connected to a frequency-division number variable input of the second AND circuit.

Further, the prescaler circuit may have a function of controlling a frequency division number among 1/N, 1/(N+1) and 1/(N+2) by controlling the modulus signals input to the first and the second NOR circuits.

Further, the prescaler circuit may have a function of controlling frequency division between 1/8-frequency-division and 1/16-frequency-division by controlling the modulus signal input to the third AND circuit.

Further, the prescaler circuit may have a function of controlling a frequency division number among 1/N, 1/(N+1) and 1/(N+2) by controlling the modulus signals input to the first and the second NOR circuits and a function of controlling frequency division between 1/8-frequency-division and 1/16-frequency-division by controlling the modulus signal input to the third AND circuit, whereby the frequency division number of the prescaler circuit can be varied among 1/8, 1/9, 1/10, 1/16, 1/17 and 1/18.

Further, frequency division numbers of 1/8, 1/9 and 1/10 may be output from the positive output of the fifth DFF circuit, and frequency division numbers of 1/16, 1/17 and 1/18 may be output from the positive output of the sixth DFF circuit.

Further, the prescaler circuit may include an output switching circuit to which a signal from the positive outputs of the fifth and the sixth DFF circuits is input. An output of the prescaler circuit may be an output of the output switching circuit, and an output signal of the prescaler circuit can be switched between a signal with frequency division numbers of 1/8, 1/9 and 1/10 and a signal with frequency division numbers of 1/16, 1/17 and 1/18 in accordance with a switching control signal applied to the output switching circuit.

Further, the modulus signal input to the third AND circuit may be used as the switching control signal.

The following describes embodiments of the present invention, with reference to the drawings.

Figure 2:
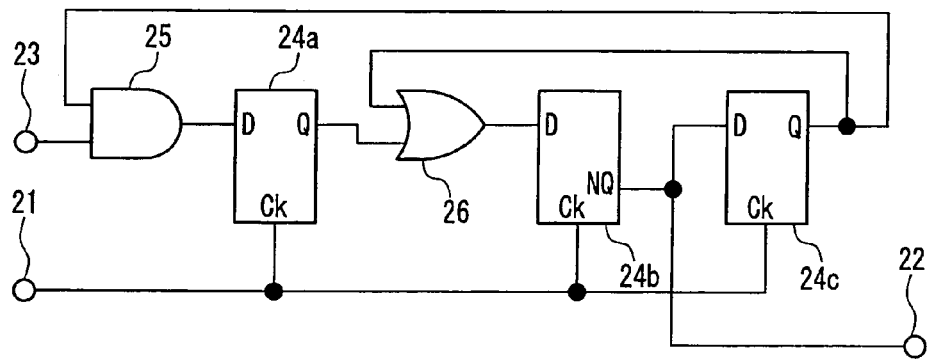
FIG. 2 is a circuit diagram showing another conventional prescaler.
Figure 6:
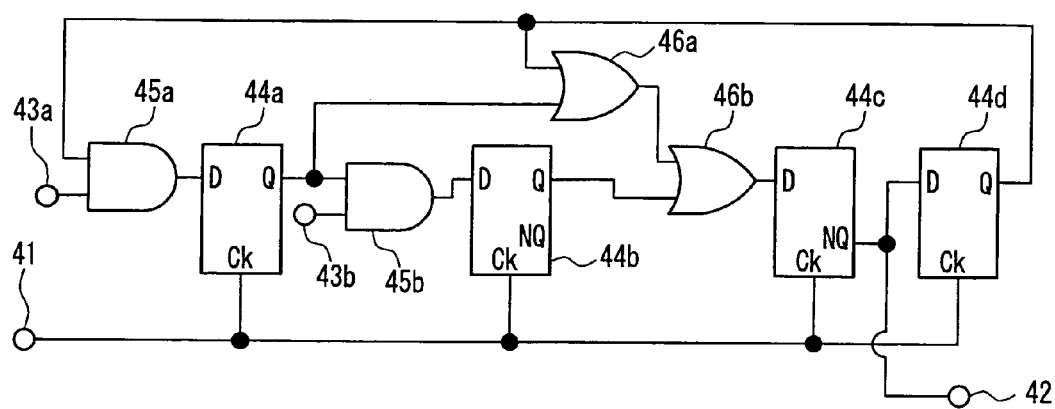
FIG. 6 is a circuit diagram showing a prescaler according to one embodiment of the present invention.

FIG. 6 is a circuit diagram of a prescaler circuit according to one embodiment of the present invention, which is composed of four DFF circuits, two AND circuits, and two OR circuits. This prescaler circuit is configured to include one DFF circuit, one AND circuit and one OR circuit in addition to the prescaler circuit shown in FIG. 2, which is for allowing frequency division numbers of 1/4, 1/5 and 1/6 to be obtained.

A clock signal that is input from a clock input terminal 41 is input through clock inputs of first through fourth DFF circuits 44*a*, 44*b*, 44*c* and 44*d*. A data input of the first DFF circuit 44*a* is connected to a Q output of the fourth DFF circuit 44*d* via a first input of a first AND circuit 45*a*. A data input of the second DFF circuit 44*b* is connected to a Q output of the first DFF circuit 44*a* via a first input of a second AND circuit 45*b*.

A first input of a first OR circuit 46*a* is connected to the Q output of the fourth DFF circuit 44*d*, and a second input of the first OR circuit 46*a* is connected to a Q output of the first DFF circuit 44*a*. A first input of a second OR circuit 46*b* is connected to an output of the first OR circuit 46*a*, and a second input of the second OR circuit 46*b* is connected to a Q output of the second DFF circuit 44*b*. A data input of the third DFF circuit 44*c* is connected to an output of the second OR circuit 46*b*, and a data input of the fourth DFF circuit 44*d* is connected to a NQ output of the third DFF circuit 44*c*, whereby one feedback loop is configured.

By using a second input of the first AND circuit 45*a* as a mode switching terminal 43*a* and a second input of the second AND circuit 45*b* as a mode switching terminal 43*b*, output signals in three modes of 1/4-, 1/5- and 1/6-frequency-division can be obtained from the NQ output of the third DFF circuit 44*c* as an output terminal 42, in accordance with control signals from the mode switching terminals 43*a* and 43*b*.

Figure 7:
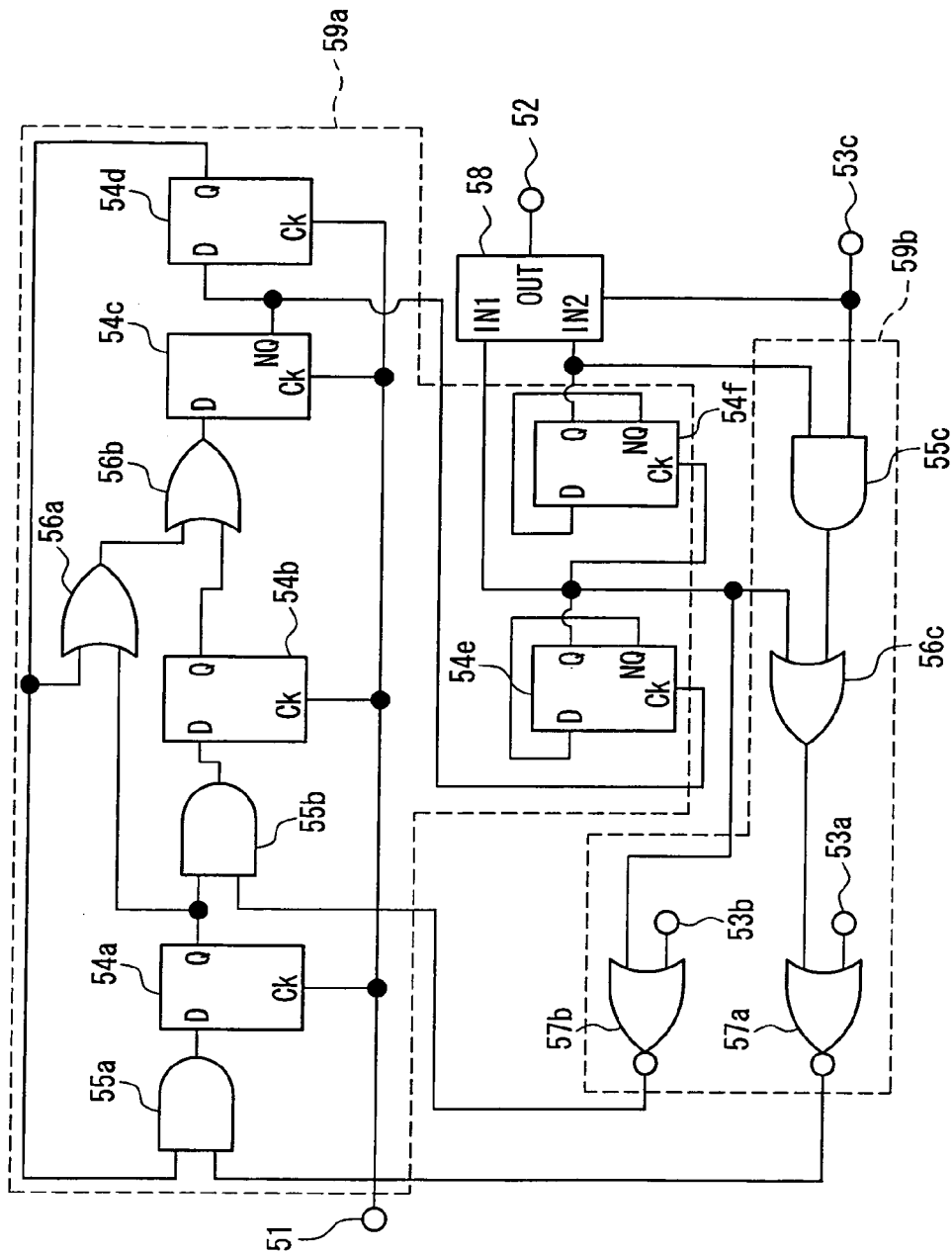
FIG. 7 is a circuit diagram showing a prescaler, which includes a switching control part added to the configuration of FIG. 6.

FIG. 7 shows a configuration including two DFF circuits, one AND circuit, one OR circuit and two NOR circuits in addition to the prescaler circuit shown in FIG. 6, which is for allowing frequency division numbers for 1/8-, 1/9-, 1/10-, 1/16-, 1/17- and 1/18-frequency-division to be obtained. A frequency number switching part 59*a* is composed of a portion including fifth and sixth DFF circuits 54*e* and 54*f* added to the configuration corresponding to the prescaler circuit of FIG. 6. A frequency division switching control part 59*b* is composed of a third AND circuit 55*c*, a third OR circuit 56*c*, a first NOR circuit 57*a* and a second NOR circuit 57*b*.

A clock signal that is input from a clock input terminal 51 is input through clock inputs of four DFF circuits 54*a*, 54*b*, 54*c* and 54*d*. A data input of the first DFF circuit 54*a* is connected to a Q output of the fourth DFF circuit 54*d* via a first input of a first AND circuit 55*a*. A data input of the second DFF circuit 54*b* is connected to a Q output of the first DFF circuit 54*b* via a first input of a second AND circuit 55*b*.

A first input of a first OR circuit 56*a* is connected to the Q output of the fourth DFF circuit 54*d*, and a second input of the first OR circuit 56*a* is connected to a Q output of the first DFF circuit 54*a*. A first input of a second OR circuit 56*b* is connected to an output of the first OR circuit 56*a* and a second input of the second OR circuit 56*b* is connected to a Q output of the second DFF circuit 54*b*. A data input of the third DFF circuit 54*c* is connected to an output of the second OR circuit 56*b*. A data input of the fourth DFF circuit 54*d* is connected to a NQ output of the third DFF circuit 54*c*, whereby one feedback loop is configured.

A clock input of the fifth DFF circuit 54*e* is connected to the NQ output of the third DFF circuit 54*c*. A data input of the fifth DFF circuit 54*e* is connected to a NQ output of the fifth DFF circuit 54*e*, whereby a feedback loop is configured with the fifth DFF circuit 54e. A clock input of the sixth DFF circuit 54f is connected to a Q output of the fifth DFF circuit 54e. A data input of the sixth DFF circuit 54f is connected to a NQ output of the sixth DFF circuit 54f, whereby a feedback loop is configured with the sixth DFF circuit 54f.

A first input of the third AND circuit 55c is connected to a Q output of the sixth DFF circuit 54f. A first input of the third OR circuit 56c is connected to the Q output of the fifth DFF circuit 54e, and a second input thereof is connected to an output of the third AND circuit 55c. A first input of the first NOR circuit 57a is connected to an output of the third OR circuit 56c. An output of the first NOR circuit 57a is connected to a second input of the first AND circuit 55a. A first input of the second NOR circuit 57b is connected to the Q output of the fifth DFF circuit 54e. An output of the second NOR circuit 57b is connected to a second input of the second AND circuit 55b.

The Q outputs of the fifth and the sixth DFF circuits 54e and 54f are rendered as an output of the prescaler, which are connected so as to be switched by an output changing switch 58, thus forming a single output terminal. As a switching control signal for the output changing switch 58, a modulus signal input to the third AND circuit 55c is used.

Figure 3:
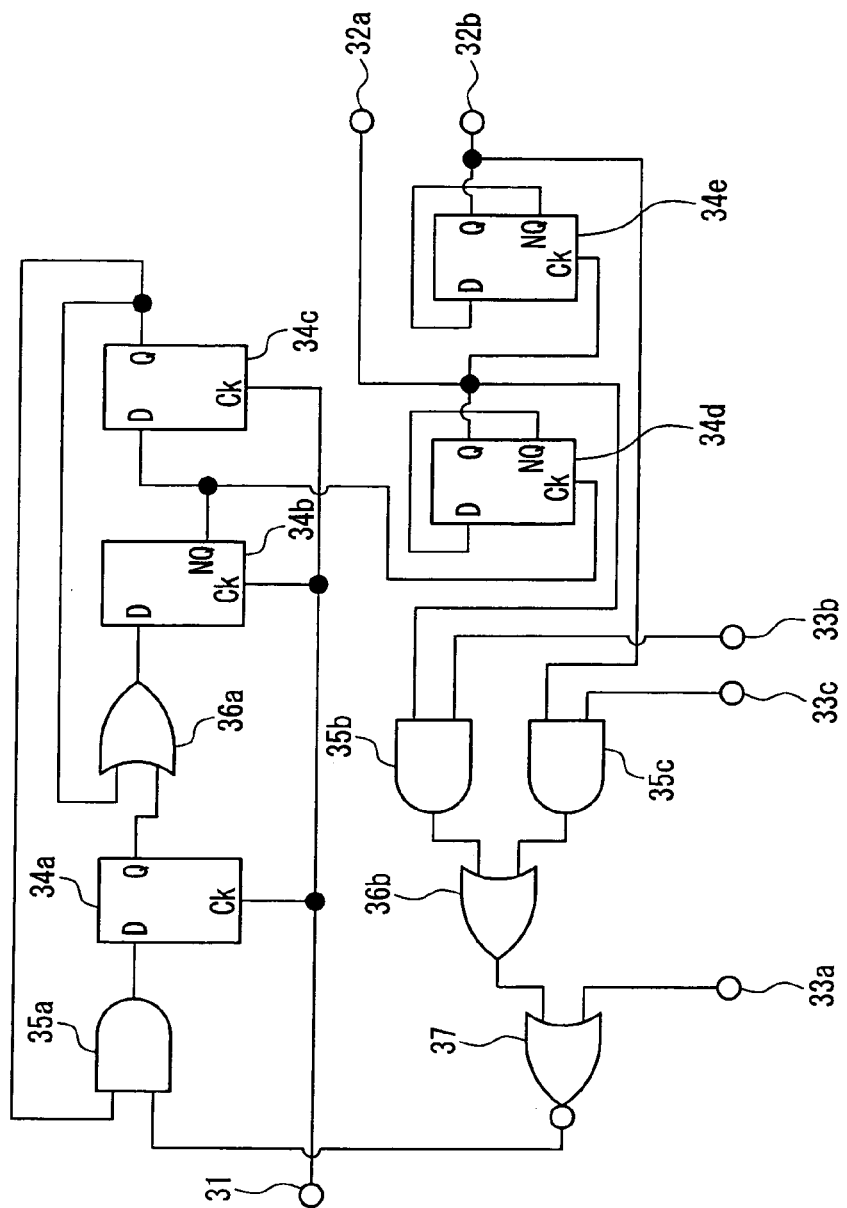
FIG. 3 is a circuit diagram showing a still another conventional prescaler, which includes a switching control part added to the configuration of FIG. 2.
Figure 4:
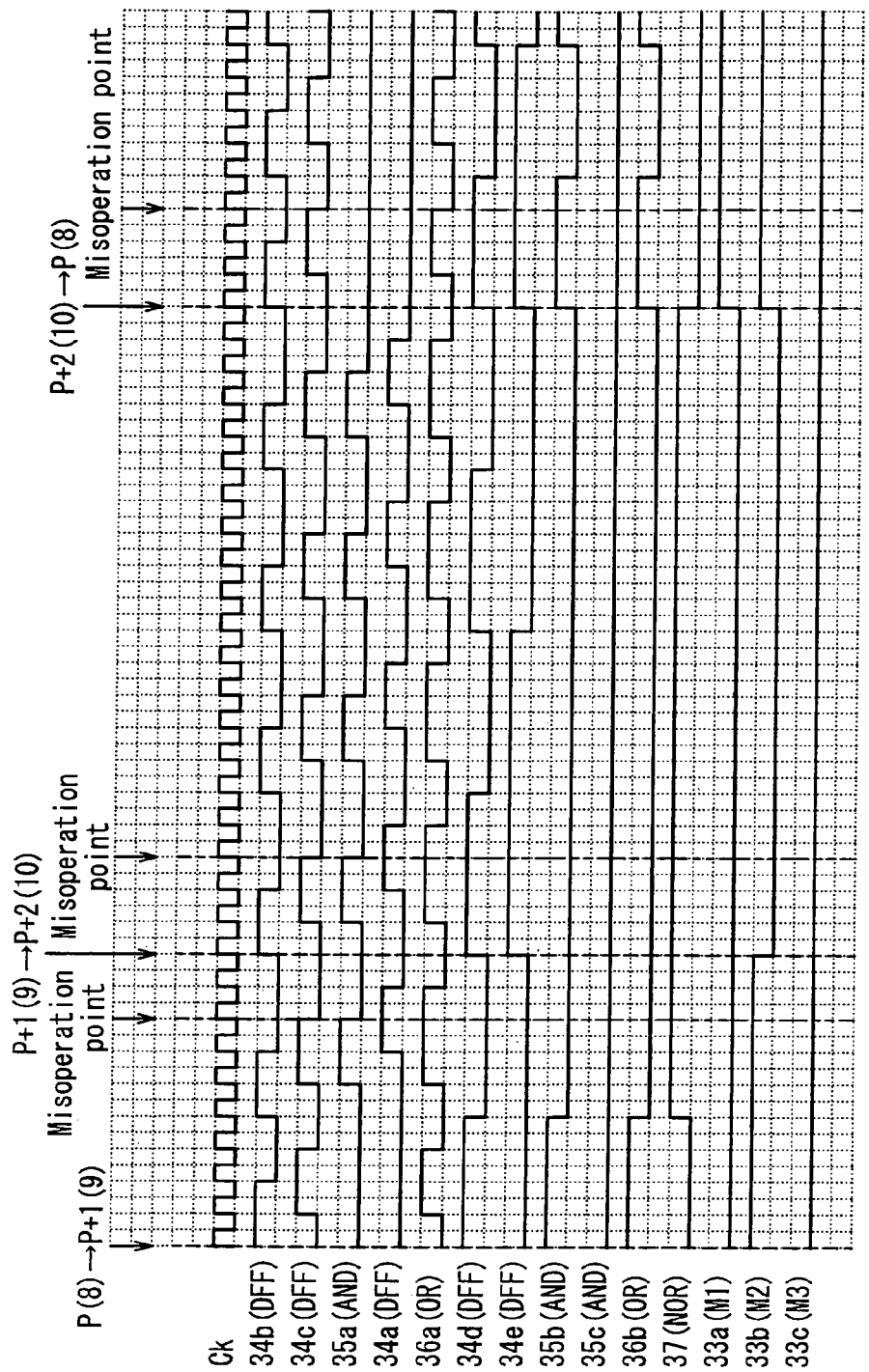
FIG. 4 is a timing diagram of the conventional prescaler of FIG. 3, showing the case of the frequency division numbers of ⅛, ⅑ and 1/10.
Figure 5:
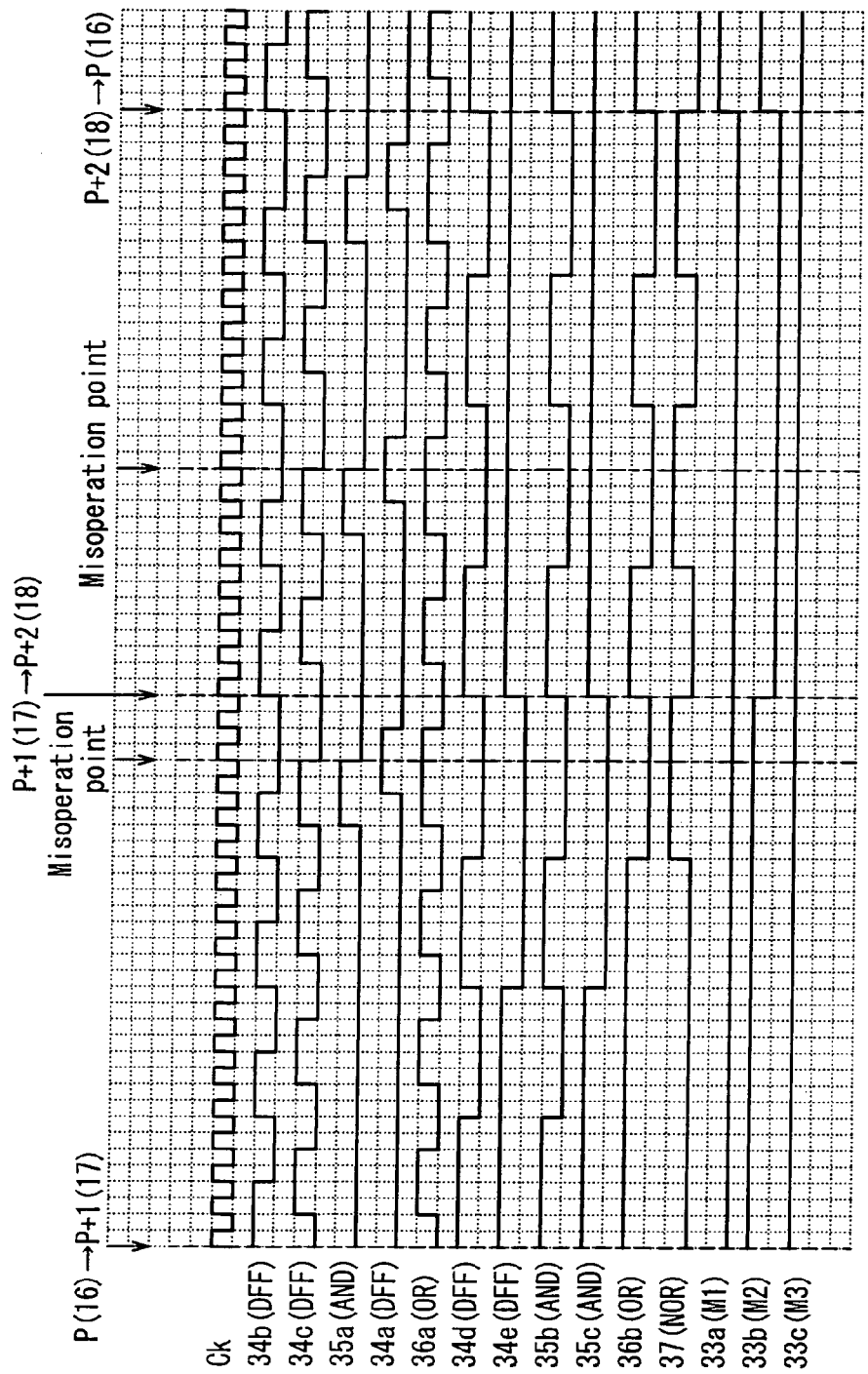
FIG. 5 is a timing diagram of the same prescaler, showing the case of the frequency division numbers of 1/16, 1/17 and 1/18.

A second input of the first NOR circuit 57a is used as a first mode switching terminal 53a, a second input of the second NOR circuit 57b is used as a second mode switching terminal 53b and a second input of the third AND circuit 55c is used as a third mode switching terminal 53c. In accordance with control signals from the first, the second and the third mode switching terminals 53a, 53b and 53c, frequency division outputs with frequency division numbers of ⅛, ⅑, ⅒, 1/16, 1/17 and 1/18, which are from the Q outputs of the fifth and sixth DFF circuits 54d and 54e, can be obtained through the output terminal 52 via the output changing switch 58. Similarly to the prescaler circuit shown in FIG. 3, the frequency division numbers of the output signals corresponding to the control signals M1, M2 and M3 from the first, the second and the third mode switching terminals 53a, 53b and 53c are as shown in Table 1.

In the above configuration, since the fifth DFF circuit 54e is added to the configuration corresponding to that of the prescaler circuit of FIG. 6, the output with the frequency division number of ⅛ can be obtained from the positive output of the fifth DFF circuit 54e. Further, since the sixth DFF circuit 54f is added, the output with the frequency division number of 1/16 can be obtained from the positive output of the sixth DFF circuit 54f.

The frequency number switching part 59a has a function of controlling the frequency division among frequency division numbers of 1/N, 1/(N+1) and 1/(N+2) by controlling a modulus signal input to the first and the second NOR circuits 57a and 57b.

The frequency division switching control part 59b has a function of controlling the frequency division between ⅛ and 1/16 by controlling a modulus signal input to the third AND circuit 55c. The combination of both of these functions allows the frequency division number to be variable as in ⅛, ⅑, ⅒, 1/16, 1/17 and 1/18.

Also, the output of the output changing switch 58, which is the output signal of the prescaler circuit, can be switched between signals with frequency division numbers of ⅛, ⅑ and ⅒ and signals with frequency division numbers of 1/16, 1/17 and 1/18, in accordance with the modulus signal input to the third AND circuit 55c.

Figure 8:
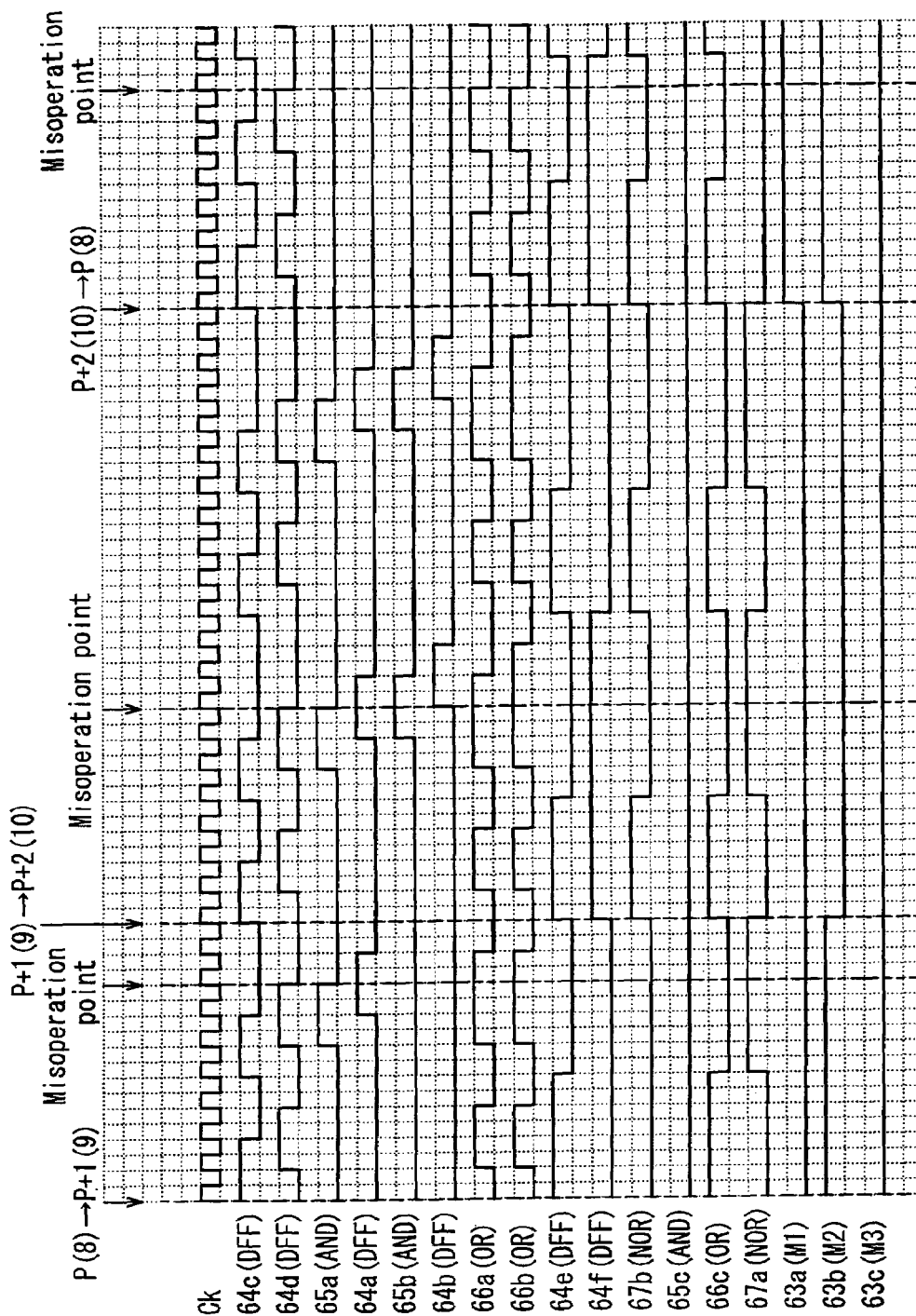
FIG. 8 is a timing diagram of the prescaler of FIG. 7, showing the case of the frequency division numbers of ⅛, ⅑ and 1/10.
Figure 9:
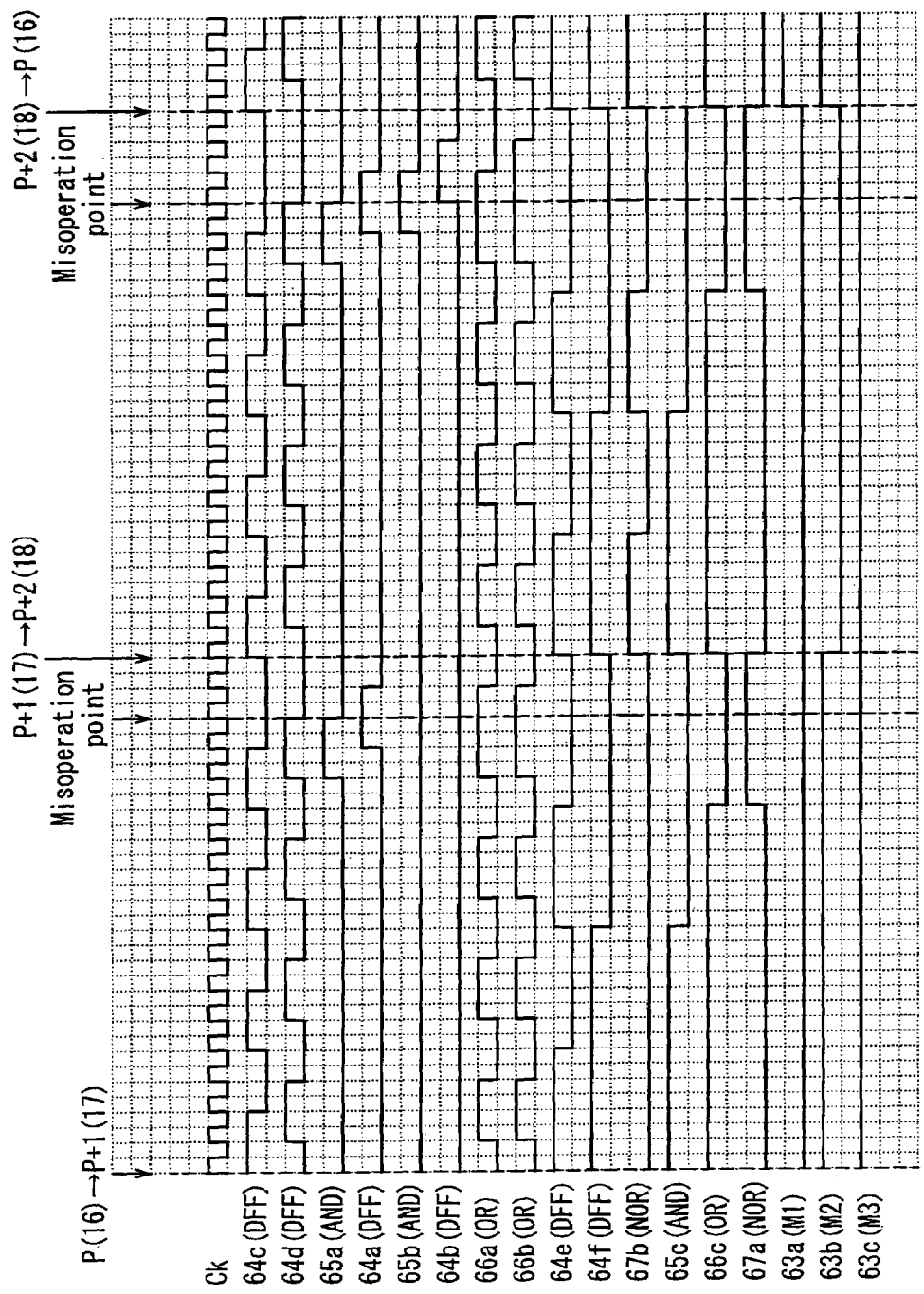
FIG. 9 is a timing diagram of the same prescaler, showing the case of the frequency division numbers of 1/16, 1/17 and 1/18.

FIG. 8 and FIG. 9 are timing diagrams of the prescaler circuit shown in FIG. 7, where FIG. 8 shows the case of the frequency division numbers of ⅛, ⅑ and ⅒ and FIG. 9 shows the case of the frequency division numbers of 1/16, 1/17 and 1/18. In the prescaler circuit shown in FIG. 7, an output signal from the output terminal 52 of the prescaler circuit is input to a logic part, and a modulus signal thereof is input to modulus signal input terminals 53a, 53b and 53c of the prescaler circuit. As shown in FIG. 8, a margin for misoperation when these signals are input to the second signal of the first AND circuit 55a is within 7 clock signals at the time of switching from ⅛-frequency-division to ⅑-frequency-division, is within 7 clock signals at the time of switching from ⅑-frequency-division to ⅒-frequency-division and is within 7 clock signals at the time of switching from ⅒-frequency-division to ⅛-frequency-division. Further, as shown in FIG. 9, the margin is within 15 clock signals at the time of switching from 1/16-frequency-division to 1/17-frequency-division, is within 15 clock signals at the time of switching from 1/17-frequency-division to 1/18-frequency-division and is within 15 clock signals at the time of switching from 1/18-frequency-division to 1/16-frequency-division (outside the drawing).

In this way, in the prescaler circuit shown in FIG. 7, the margins for misoperation by way of a logic part can be increased from 3 clock signals to 7 clock signals at the time of switching from ⅑-frequency-division to ⅒-frequency-division and at the time of switching from ⅒-frequency-division to ⅛-frequency-division. Further, the margins can be increased from 7 clock signals to 15 clock signals at the time of switching from 1/17-frequency-division to 1/18-frequency-division and at the time of switching from 1/18-frequency-division to 1/16-frequency-division. Herein, the modulus control signal does not change from that in the prescaler circuit shown in FIG. 3. Since the margins for misoperation can be enlarged, misoperation by the prescaler can be avoided.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A prescaler circuit, comprising:
   first to fourth D-type flip-flop (DFF) circuits;
   first and second AND circuits; and
   first and second OR circuits,
   wherein an output of the first AND circuit is connected to a data input of the first DFF circuit, a positive output of the first DFF circuit is connected to one input of the second AND circuit, an output of the second AND circuit is connected to a data input of the second DFF circuit, a positive output of the fourth DFF circuit and the positive output of the first DFF circuit are connected to inputs of the first OR circuit, an output of the first OR circuit is connected to one input of the second OR circuit, a positive output of the second DFF circuit is connected to the other input of the second OR circuit, an output of the second OR circuit is connected to a data input of the third DFF circuit, a negative output of the third DFF circuit is connected to a data input of the fourth DFF circuit, and the positive output of the fourth DFF circuit is connected to one input of the first AND circuit, and
   a modulus signal is input to the other input of the first AND circuit, another modulus signal different from the modulus signal input to the first AND circuit is input to the other input of the second AND circuit, and a frequency division number of the prescaler circuit is made variable by controlling the modulus signals input to the first AND circuit and the second AND circuit.

2. The prescaler circuit according to claim 1, wherein a common clock signal is input to clock inputs of the first to the fourth DFF circuits, so as to enable synchronization among the first to the fourth DFF circuits.

3. The prescaler circuit according to claim 1, further comprising a fifth DFF circuit,
wherein the negative output of the third DFF circuit is connected to a clock input of the fifth DFF circuit, a negative output of the fifth DFF circuit is connected to a data input of the fifth DFF circuit, and output with a frequency division number of 1/8 is enabled from a positive output of the fifth DFF circuit by controlling an input signal to modulus inputs of the first and the second AND circuits.

4. The prescaler circuit according to claim 3, further comprising a sixth DFF circuit,
wherein the positive output of the fifth DFF circuit is connected to a clock input of the sixth DFF circuit, a negative output of the sixth DFF circuit is connected to a data input of the sixth DFF circuit, and output with a frequency division number of 1/16 is enabled from a positive output of the sixth DFF circuit by controlling an input signal to modulus inputs of the first and the second AND circuits.

5. The prescaler circuit according to claim 4, further comprising a frequency division switching control part including: a third AND circuit; a third OR circuit; a first NOR circuit; and a second NOR circuit,
wherein the positive output of the sixth DFF circuit is connected to one input of the third AND circuit, a modulus signal is input to the other input of the third AND circuit, an output of the third AND circuit is connected to one input of the third OR circuit, the positive output of the fifth DFF circuit is connected to the other input of the third OR circuit, an output of the third OR circuit is connected to one input of the first NOR circuit, another modulus signal different from the modulus signal input to the third AND circuit is input to the other input of the first NOR circuit, an output of the first NOR circuit is connected to a frequency-division number variable input of the first AND circuit, the positive output of the fifth DFF circuit is connected to one input of the second NOR circuit, still another modulus signal different from the modulus signals input to the third AND circuit and the first NOR circuit is input to the other input of the second NOR circuit, and an output of the second NOR circuit is connected to a frequency-division number variable input of the second AND circuit.

6. The prescaler circuit according to claim 5, wherein the prescaler circuit has a function of controlling a frequency division number among 1/N, 1/(N+1) and 1/(N+2) by controlling the modulus signals input to the first and the second NOR circuits.

7. The prescaler circuit according to claim 5, wherein the prescaler circuit has a function of controlling frequency division between 1/8-frequency-division and 1/16-frequency-division by controlling the modulus signal input to the third AND circuit.

8. The prescaler circuit according to claim 5, wherein the prescaler circuit has a function of controlling a frequency division number among 1/N, 1/(N+1) and 1/(N+2) by controlling the modulus signals input to the first and the second NOR circuits and a function of controlling frequency division between 1/8-frequency-division and 1/16-frequency-division by controlling the modulus signal input to the third AND circuit, whereby the frequency division number of the prescaler circuit can be varied among 1/8, 1/9, 1/10, 1/16, 1/17 and 1/18.

9. The prescaler circuit according to claim 8,
wherein frequency division numbers of 1/8, 1/9 and 1/10 are output from the positive output of the fifth DFF circuit, and
frequency division numbers of 1/16, 1/17 and 1/18 are output from the positive output of the sixth DFF circuit.

10. The prescaler circuit according to claim 9, further comprising an output switching circuit to which a signal from the positive outputs of the fifth and the sixth DFF circuits is input,
wherein an output of the prescaler circuit is an output of the output switching circuit, and
an output signal of the prescaler circuit can be switched between a signal with frequency division numbers of 1/8, 1/9 and 1/10 and a signal with frequency division numbers of 1/16, 1/17 and 1/18 in accordance with a switching control signal applied to the output switching circuit.

11. The prescaler circuit according to claim 10, wherein the modulus signal input to the third AND circuit is used as the switching control signal.

* * * * *